United States Patent
Amaro et al.

(10) Patent No.: US 8,217,674 B2
(45) Date of Patent: Jul. 10, 2012

(54) SYSTEMS AND METHODS TO TEST INTEGRATED CIRCUITS

(75) Inventors: Michael G. Amaro, Naperville, IL (US); Yuwei Luo, Naperville, IL (US); John M. Bonfitto, Lemont, IL (US); Michael J. Kane, Oswego, IL (US)

(73) Assignee: Texas Instruments Incorporated, Dallas, TX (US)

( * ) Notice: Subject to any disclaimer, the term of this patent is extended or adjusted under 35 U.S.C. 154(b) by 343 days.

(21) Appl. No.: 12/702,048

(22) Filed: Feb. 8, 2010

(65) Prior Publication Data
US 2011/0193581 A1 Aug. 11, 2011

(51) Int. Cl.
*G01R 31/00* (2006.01)
(52) U.S. Cl. ......... 324/756.01; 324/757.02; 324/750.01
(58) Field of Classification Search .................. None
See application file for complete search history.

(56) References Cited

U.S. PATENT DOCUMENTS 7,388,392 B2 * 6/2008 Brandorff ................ 324/756.04
7,724,004 B2 * 5/2010 Eldridge et al. ......... 324/750.27

* cited by examiner

*Primary Examiner* — Melissa Koval
*Assistant Examiner* — Trung Nguyen
(74) *Attorney, Agent, or Firm* — William B. Kempler; Wade J. Brady, III; Frederick J. Telecky, Jr.

(57) ABSTRACT

Open and short systems and methods for testing integrated circuits are disclosed. An example implementation includes engaging an integrated circuit testing module with an integrated circuit testing apparatus, the integrated circuit testing module for receiving an integrated circuit, a first set of contact points, and a second set of contact points; engaging a first probe onto at least one of the contact points of the first set of contact points, controllably engaging at least one of a second probe onto at least one contact pair of the integrated circuit testing module, and providing an electrical stimulus to the integrated circuit testing module.

20 Claims, 7 Drawing Sheets

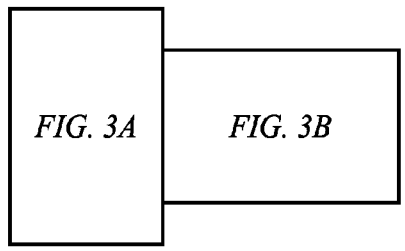
*FIG. 3*
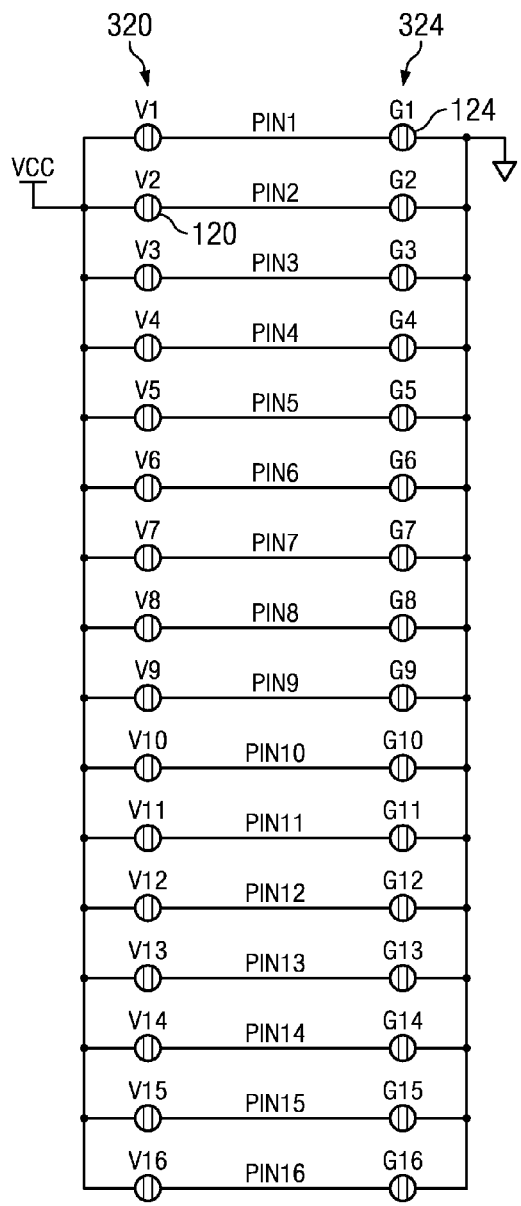
*FIG. 3A*
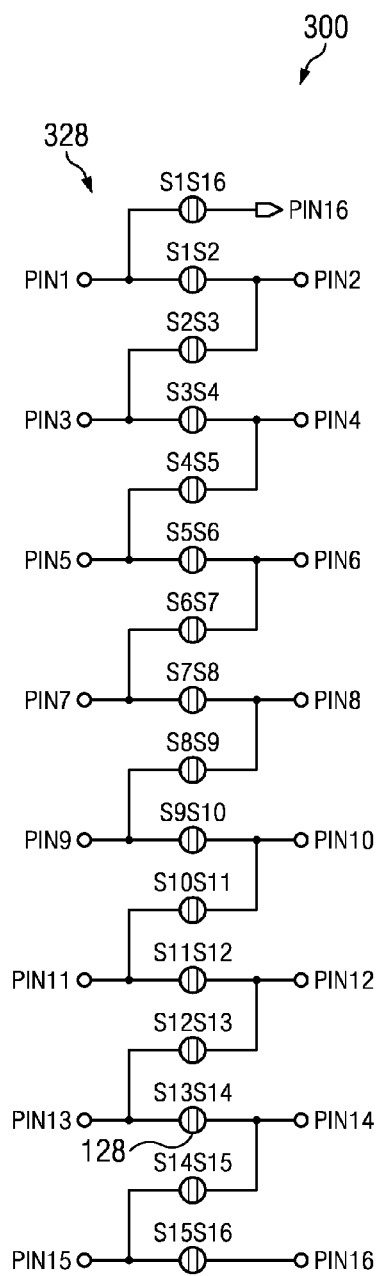
ADJACENT PIN CONNECTION

SYSTEMS AND METHODS TO TEST INTEGRATED CIRCUITS

TECHNICAL FIELD

The present disclosure pertains to circuitry testing platforms and, more specifically, to, systems and methods to test integrated circuits.

BACKGROUND

Integrated circuits are typically tested to determine how they will perform when used in different scenarios. Testing is performed either by subjecting the integrated circuit to a set of physical tests, or by simulating how a model of the integrated circuit would perform under those same set of physical tests. Simulated testing provides integrated circuit designers and users with the means to determine how a circuit will perform under model conditions. Most model conditions, however, do not account for gross variations in circuit performance due to problems such as manufacturing defects, improper installation, etc. Therefore, prior to final use of a particular integrated circuit, it is advisable that physical testing be performed which would account for problems such as manufacturing defects.

When implementing physical tests accounting for conditions such as manufacturing defects and improper installations, a test engineer determines what potential problems could arise and manually tests the integrated circuit by either open-circuiting a pin or set of pins or short-circuiting a pin or set of pins. Depending on the number of pins on the integrated circuit undergoing the tests, hundreds of combinations of open circuits and short circuits may need to be tested. Alternatively, the integrated circuit may be tested electronically. For example, relays or solid state transistors may be used to test the integrated circuit.

DETAILED DESCRIPTION

Certain examples are shown in the above-identified figures and described in detail below. In describing these examples, like or identical reference numbers are used to identify the same or similar elements. The figures are not necessarily to scale and certain features and certain views of the figures may be shown exaggerated in scale or in schematic for clarity and/or conciseness. Additionally, several examples have been described throughout this specification. Any features from any example may be included with, a replacement for, or otherwise combined with other features from other examples.

Example methods and apparatus disclosed herein enable the open and short testing of an integrated circuit. In an example method, an integrated circuit testing module is engaged into an integrated circuit testing apparatus. The testing apparatus operates the integrated circuit, subjects the integrated circuit to an external stimulus, and records the result of such stimulus. Stimuli subjected on the integrated circuit may include short-circuiting a pin or set of pins to ground, power, or neighboring pins or open-circuiting a pin or set of pins from any electrical connection.

This testing allows integrated circuit manufacturers to inform their customers how a circuit will perform in the event that the integrated circuit is installed, manufactured, or functions improperly. For example, a customer may want to know if there are any configurations that would result in inoperability of the circuit, damage to other components, or catastrophic failures. Such configurations may include pins of the integrated circuit being soldered to each other (i.e., short circuits), pins of the integrated circuit not being connected to the circuit board (i.e., open circuits), and/or pins of the integrated circuit being connected to power or ground.

The disclosed example methods, apparatus, and articles of manufacture are advantageous in several respects. For example, in traditional physical testing of integrated circuits a test engineer must manually test every failure combination (e.g., different combinations of device pins being open-circuited and/or short-circuited.) Manually testing these combinations takes quite a long time, and is prone to human measurement errors. Automated methods of testing have been used such as connecting the integrated circuit to a set of relays or transistors. When testing a circuit with a set of relays or transistors the circuit is typically attached to the relays or transistors by a cable, which is usually at least a few inches in length. Such additional cable length is undesirable because of additional inductances and/or capacitances that are added to the testing system. A more desirable system is one that uses the shortest possible conductor between the test points, and tests in an automated fashion.

Figure 1:
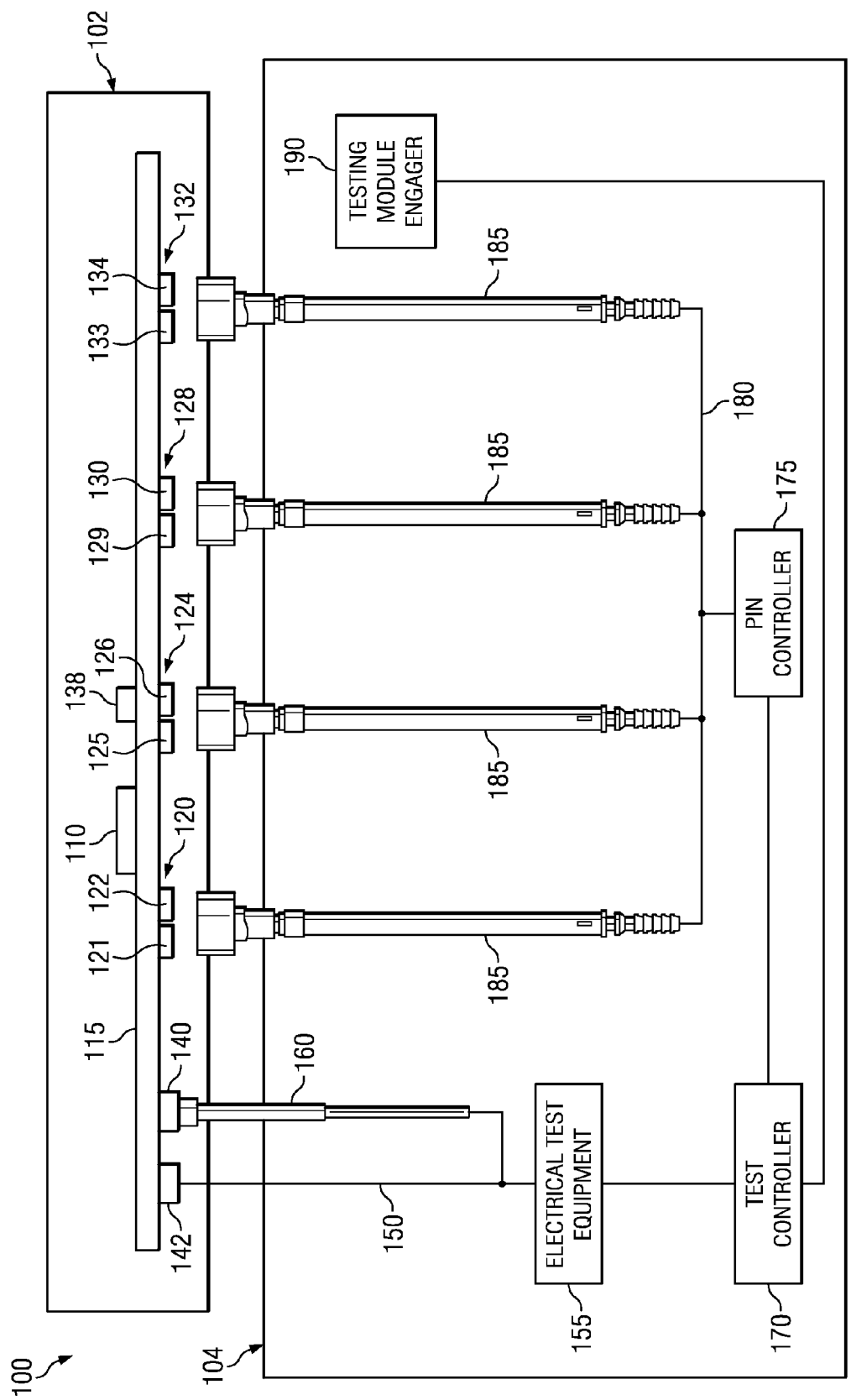
FIG. 1 is a block diagram of an example system for open and short testing of integrated circuits.

FIG. 1 is a block diagram of an example system for open and short testing of integrated circuits. The example system 100 includes an integrated circuit testing module 102 (to which an integrated circuit 110 undergoing the test may be connected), a printed circuit board 115, a short-to-power contact pair 120 (having a first and second contact point 121 and 122), a short-to-ground contact pair 124 (having a first and second contact point 125 and 126), a short-to-adjacent-pin contact pair 128 (having a first and second contact point 129 and 130), a open-pin contact pair 132 (having a first and second contact point 133 and 134), electrical components 138, a first set of interconnection points 140, and a second set of interconnection points 142. The example system 100 also includes an integrated circuit testing apparatus 104 including a cable 150, electrical test equipment 155, probes 160, a test controller 170, a pin controller 175, pin control lines 180, pogo pins 185, and a testing module engager 190. The example integrated circuit testing module 102 interfaces with the integrated circuit testing apparatus 104 by means of the contact pairs 120 and the sets of interconnection points 140 and 142. Alternatively, other hardwired connections (e.g., power, ground, etc.) may be provided.

The integrated circuit 110 may be any integrated circuit. As described below, in the illustrated example, the integrated circuit 110 is a power control integrated circuit having 16 pins, however any other circuitry having any amount of pins could also be used. Additionally, in the illustrated example, the integrated circuit testing module 102 is configured to function with a 16-pin integrated circuit. Therefore, any 16-pin integrated circuit could be tested via the integrated circuit testing module 102. However, the integrated circuit module 102 may be alternatively designed to function with devices having any number of pins.

As described below in conjunction with FIGS. 2 and 3, the contact pairs 120, 124, 128, and 132 are dimensioned and aligned so that the pogo pins 185, when activated, cause an electrical short to be created between two contact points of the contact pairs 120, 124, 128, and 132. In the example described herein (and further described in conjunction with FIG. 2), the contact pairs are aligned in groups of two contact points, wherein the two contact points form a square separated by a saw tooth shaped gap. Any alternative shape of contact pairs may be used such as, for example, two half circles, two jumper pins, etc. In the illustrated example, there are four contact pairs 120, 124, 128, and 132 to illustrate the four different uses of contact pairs. There may be any number of contact pairs 120, 124, 128, and 132. For example, in the examples shown in FIGS. 2 and 3, there are 16 contact pairs of each type totaling 64 contact pairs, in order to accommodate for a 16-pin integrated circuit. Further, the number of contact pairs need not directly depend on the number of pins of the integrated circuit.

The second set of interconnection points 142 allow signals (e.g., power, ground, integrated circuit control signals, etc.) to be delivered to the integrated circuit testing module 102. The first set of interconnection points 140 allows measurements to be taken. The interconnection points may be any shape and size. In the example implementation, the first set of interconnection points 140 are configured to interface with the electrical test equipment 155 via the probes 160, while the second set of interconnection points 142 are configured to interface with the electrical test equipment 155 via the cable 150. In the example provided herein, the probes 160 used to interface with the interconnection points 140 are spring-loaded fixed-location pins, however they could be any other type of pin such as, for example, pneumatically actuated, hydraulically actuated, electrically actuated, fixed pins, etc. In the illustrated example, the cable 150 is a ribbon cable having a plurality of conductors for transmitting signals from the electrical test equipment 155 to the integrated circuit testing module 102. Alternatively, the interconnection points may be configured to interface with the electrical test equipment 155 via only the probes 160 or only the cable 150 (e.g., the sets may be condensed.) For example, the ribbon cable may be omitted from the system such that the electrical test equipment 155 interfaces with the integrated circuit testing module 102 via only the probes 160. Further, any other method of providing an electrical connection between the interconnection points and the electrical test equipment 155 may be used.

In the illustrated example of the integrated circuit testing apparatus 104, multiple devices are contained in a single housing, however any alternative configuration may also be used such as, for example, a single device in a single housing, multiple devices in multiple housings, etc. The electrical test equipment 155 is capable of providing power and signals to the integrated circuit testing module, as well as taking measurements from the integrated circuit module. In the illustrated example, the electrical test equipment 155 is a signal generator, and an oscilloscope, however any alternative devices or combination of devices may also be used. For example, non-contact measurement equipment may be used such as, for example, thermal imagers, temperature measurement devices, etc. Additionally, the integrated circuit testing module 102 may be contained within an additional housing which provides environmental control (e.g., temperature, pressure, humidity, etc) which may allow a wider array of tests to be performed.

The test controller 170 interacts with the electrical test equipment 155 and the pin controller 175. In the illustrated example, the test controller 170 interfaces with the electrical test equipment 155 and pin controller 175 by means of a general purpose interface bus (GPIB), however any other interface may be used such as, for example, RS-232, universal serial bus (USB), transmission control protocol/internet protocol (TCP/IP), etc. In the illustrated example, the test controller is a general purpose computer, however any other type of computer may be used such as, for example, a server computer, a workstation, etc. The test controller 170 interfaces with the electrical test equipment 155 and the pin controller 175 in order to provide instructions necessary for carrying out specific tests. For example, a specific test may include actuating a specific set of pogo pins 185 (via the pin controller 175), sending a specific control signal to the integrated circuit 110 (via the electrical test equipment 155), and recording a measured output of the integrated circuit 110 (via the electrical test equipment 155.) The test controller 170 may further determine if the measured output of the integrated circuit 110 is within an acceptable range of outputs, and thereby determine if the integrated circuit 110 functions properly under a given input condition. The test controller 170 may repeat this process any number of times, with any number of given inputs and pin configurations, and with any number of acceptable outputs. Further, the test or set of tests that the test controller 170 is performing may be specifically designed for the integrated circuit 110 being tested.

The pin controller 175 receives commands from the test controller and controls the pogo pins 185. In one example, the pin controller 175 is a pneumatic controller capable of controlling 64 individual pogo pins. The pin controller could be any other kind of pin controller and may actuate any number of pogo pins by any other means such as, for example, hydraulic actuation, electronic actuation, etc. The pin control lines 180 allow the pin controller 175 to control the pogo pins 185. In the illustrated example, the pin control lines 180 are pneumatic tubes, however any other type of control line consistent with the pin controller 175 and pogo pins 185 may be used. For example, if the pogo pins 185 were electrically activated (e.g., an inductive coil moving a ferromagnetic probe via an electrical current) the pin control lines 180 would be electrical conductors capable of supplying the necessary electrical current. Additionally, any arrangement of pin control lines 180 may be used such as, for example, a single control line for every pogo pin, multiple control lines for a single pin (e.g., including a feedback sensor), a single control line for multiple pins, etc.

The pogo pins 185 are capable of receiving a control signal from the pin controller 175 via the control lines 180. In response to receiving the control signal, the pogo pins 185 activate and make contact with the contact pairs 120, 124, 128, and/or 130. As described below, the pogo pins 185 have an electrically conductive tip that creates an electrical short between two of the contact points 120. In the illustrated example, the pogo pins 185 are pneumatically actuated, however any other type of actuation could alternatively or additionally be used. Further, in the illustrated example, there are four pogo pins 185 configured to engage each of the four contact pairs 120, 124, 128, and 132. There may be any number of pogo pins 185. For example, there may be 64 pogo pins 185 so that an integrated circuit testing module 102 having 64 contact pairs 120, 124, 128, and/or 130 may be able to function with the integrated circuit testing apparatus 104. Alternatively, there may be more pogo pins 185 in order to accommodate integrated circuit testing modules 102 having a larger number of contact pairs 120, 124, 128, and/or 130.

While an example system for open and short testing of integrated circuits 100 has been illustrated in FIG. 1, the elements illustrated in FIG. 1 may be combined, divided, re-arranged, eliminated and/or implemented in any way. Further, the example open and short testing system 100 may include additional devices, controllers, equipment, probes, systems and/or processors in addition to, or instead of, those illustrated in FIG. 1, and/or may include more than one of any or all of the illustrated devices, controllers, equipment, probes, systems and/or processors.

Figure 2:
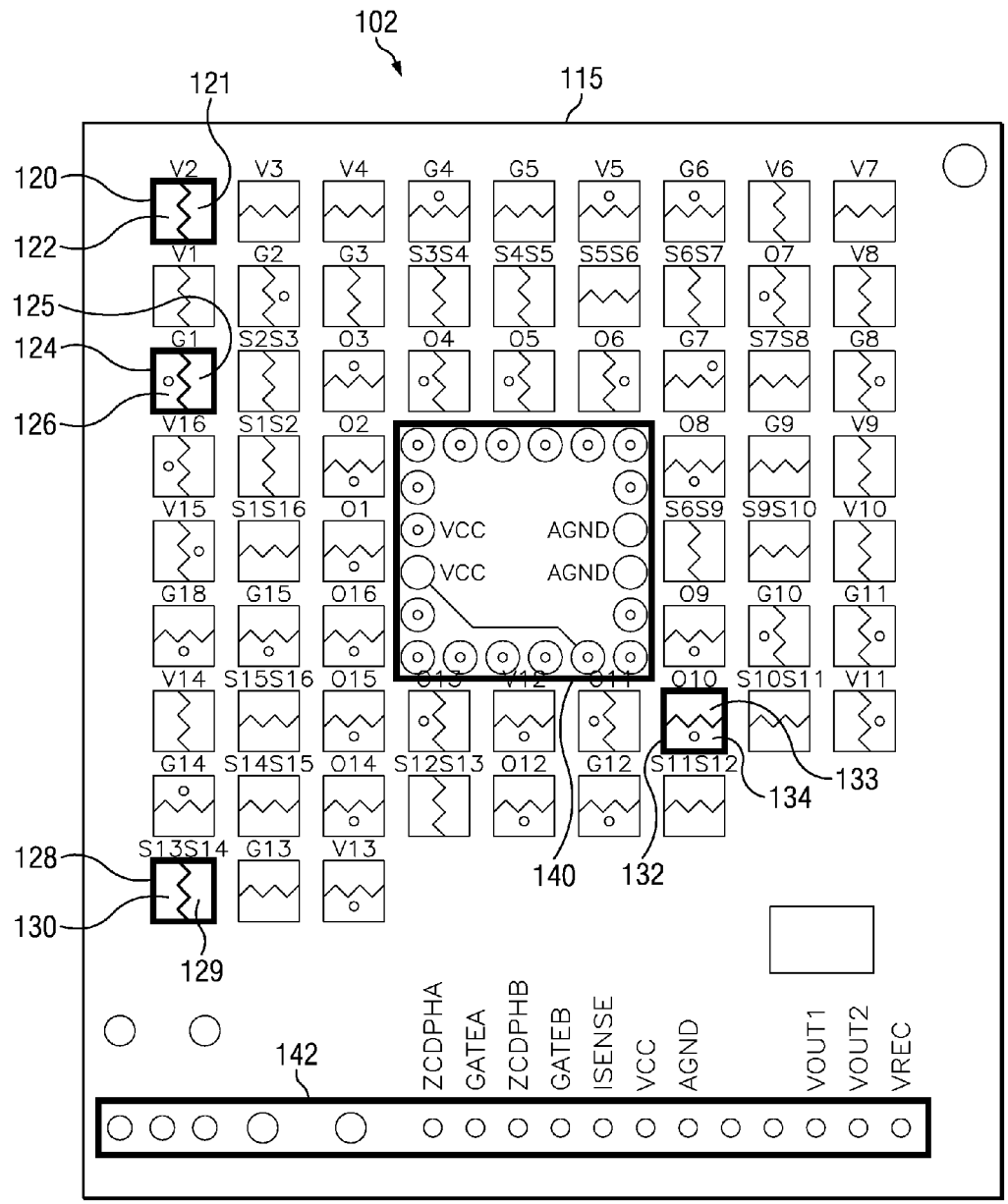
FIG. 2 is a drawing of the example integrated circuit testing module of FIG. 1.

FIG. 2 is drawing of the example integrated circuit testing module 102 of FIG. 1. The example integrated circuit testing module 102 comprises the printed circuit board 115 of FIG. 1 including the contact pairs 120, 124, 128, and 132 that may be shorted by pogo pins. Additionally, FIG. 2 contains first and second contact points 121 and 122 of the short-to-power contact pair 120, first and second contact points 125 and 126 of the short-to-ground contact pair 124, first and second contact points 129 and 130 of the short-to-adjacent-pin contact pair 128, first and second contact points 133 and 134 of the open-pin contact pair 132, the first set of interconnection points 140, and the second set of interconnection points 142. The illustrated example of FIG. 2 shows the bottom of the printed circuit board 115. As shown in FIG. 1, the top side of the printed circuit board 115 connects to the integrated circuit to be tested 110 and the electrical components 138.

Figure 3B:
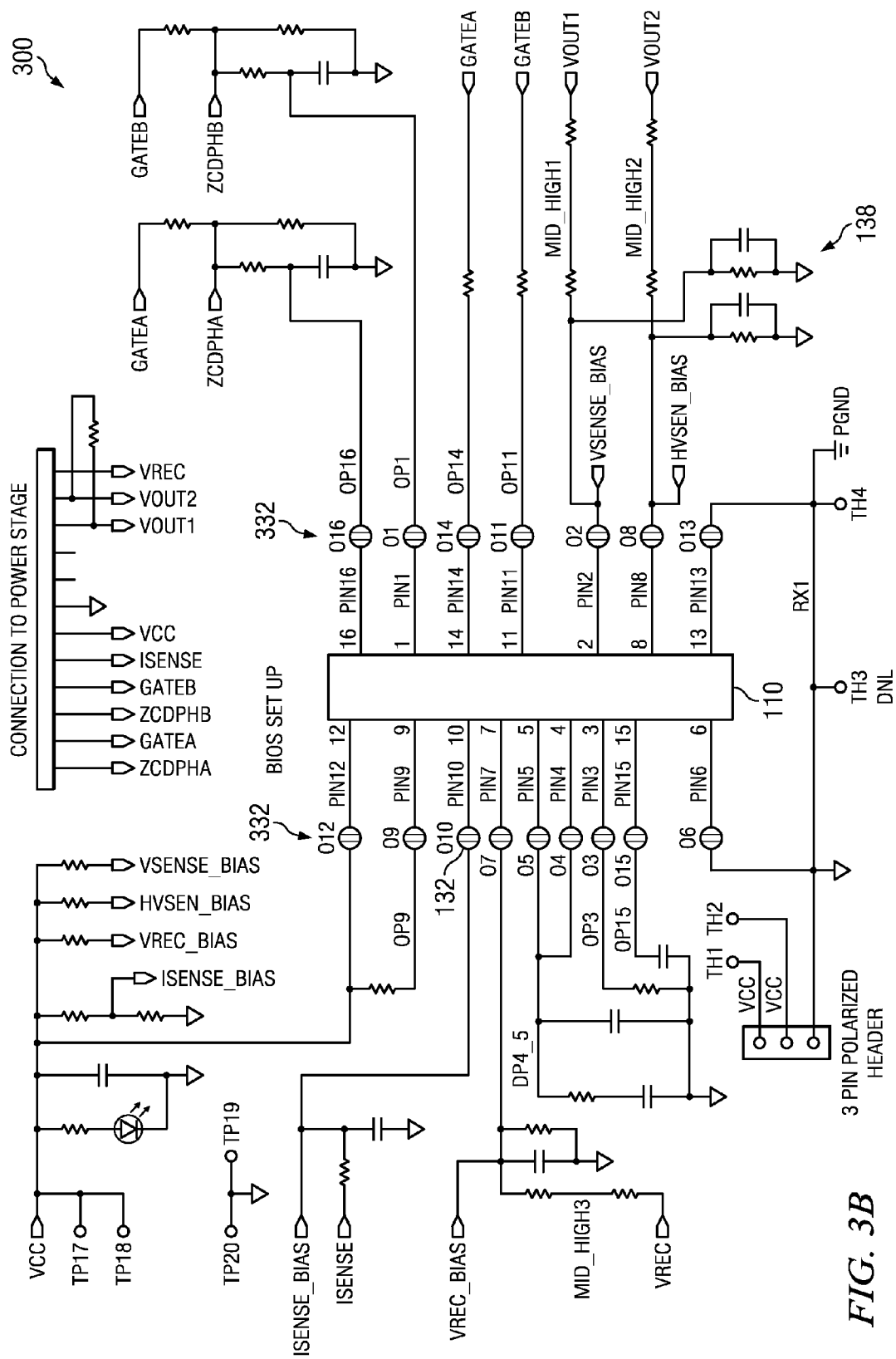
FIG. 3 is a schematic of the example integrated circuit testing module of FIG. 1.

FIG. 3 is a schematic of the example integrated circuit testing module 102 of FIG. 1. The example schematic 300 of FIG. 3 includes a group of short-to-power contact pairs 320, a group of short-to-ground contact pairs 324, a group of short-to-adjacent-pin contact pairs 328, a group of open-pin contact pairs 332, the integrated circuit 110, and the electrical components 138.

In the example implementation, the printed circuit board 115 is a multi-layer circuit board having traces that interconnect the circuit components on both sides. Additionally, the printed circuit board has pass-throughs that allow traces or components on one layer or side of the circuit board to connect to traces or components on another layer or side of the circuit board. Alternatively, any other type of circuit board may be used.

The short-to-power contact pair 120 is engaged by the pogo pin 185. The first contact point 121 of the short-to-power contact pair 120 is electrically coupled to a pin of the integrated circuit 110, while the second contact point 122 of the short-to-power contact pair 124 is electrically coupled to a power trace of the integrated circuit testing module 102. In the example shown, engaging the pogo pin 185 would cause the pin of the integrated circuit to be shorted to the power trace. In the illustrated example, there are 16 short-to-power contact pairs that allow every pin of the integrated circuit to be shorted to a power trace of the integrated circuit testing module 102. There may be more or fewer short-to-power contact pairs depending on the integrated circuit that is being tested. For example, the integrated circuit 110 may require two separate power sources (e.g., a 5 volt source and a 12 volt source), in which case there may be additional short-to-power contact pairs to allow for shorting to either power source. As an alternative example, a pin of the integrated circuit may already be connected to a power trace of the integrated circuit testing module 102 (e.g., two pins of the integrated circuit 110 are internally connected.) In that case, it may be unreasonable to test shorting that pin to the power trace again. Further, the group of short-to-power contact pairs 320 illustrates that there may be many short-to-power contact pairs 120 in the circuit. In particular, the short-to-power contact pair 120 of FIG. 3 illustrates the specific contact pair of the group of short-to-power contact pairs 320 that is shown in FIG. 2 (e.g., the contact pair 120 labeled V2 would short pin 2 of the integrated circuit 110 to a power trace of the integrated circuit testing module 102.)

The short-to-ground contact pair 124 is engaged by the pogo pin 185. The first contact point 125 of the short-to-ground contact pair 124 is electrically coupled to a pin of the integrated circuit 110, while the second contact point 126 of the short-to-ground contact pair 124 is electrically coupled to a grounding trace of the integrated circuit testing module 102. In the example shown, engaging the pogo pin 185 would cause the pin of the integrated circuit to be shorted to the grounding trace. In the illustrated example, connecting the pin of the integrated circuit to the grounding trace of the integrate circuit testing module 102 is implemented by a pass-through that connects one of the contact points of the short-to-ground contact pair 124 to a grounding trace on the opposite side of the integrated circuit testing module 102 (e.g., a grounding plane.) In the illustrated example, there are 16 short-to-ground contact pairs that allow every pin of the integrated circuit to be selectively shorted to a grounding trace of the integrated circuit testing module 102. There may be more or fewer short-to-ground contact pairs depending on the integrated circuit being tested. In particular, the short-to-ground contact pair 124 of FIG. 3 illustrates the specific contact pair of the group of short-to-ground contact pairs 324 that is shown in FIG. 2 (e.g., the contact pair 124 labeled G1 would short pin 1 of the integrated circuit 110 to a grounding plane of the integrated circuit testing module 102.)

The short-to-adjacent-pin contact pair 128 is engaged by the pogo pin 185. The first contact point 129 of the short-to-adjacent-pin contact pair 128 is electrically coupled to a first pin of the integrated circuit 110, while the second contact point 130 of the short-to-adjacent-pin contact pair 128 is electrically coupled to a second pin of the integrated circuit 110. In the example shown, engaging the pogo pin 185 would cause the first pin of the integrated circuit to be shorted to the second pin of the integrated circuit. In the illustrated example, there are 16 short-to-adjacent-pin contact pairs that allow every pin of the integrated circuit to be shorted to an adjacent pin of the integrated circuit (e.g., pin 2 may be shorted to pin 1 or pin 3, pin 4 may be shorted to pin 3 or pin 5, etc.) There may be more or fewer short-to-adjacent-pin contact pairs depending on the integrated circuit being tested. For example, if two pins of the integrated circuit are designed to be shorted together it may be unnecessary to test the result of shorting these pins together. Additionally or alternatively, the second pin may not be adjacent to the first pin. For example, the short-to-adjacent-pin contact pair 128 may be configured to short pin 1 of the integrated circuit 110 to pin 4 of the integrated circuit 110 (where there are other pins of the integrated circuit 110 physically separating pin 1 from pin 4.) In particular, the group of short-to-adjacent pin contact pairs 328 further illustrate that in the illustrated example of FIG. 2 adjacent pins of the integrated circuit may be shorted together. Further, multiple pins of the integrated circuit may be shorted together by engaging multiple short-to-adjacent-pin contact pairs 128 with multiple pogo pins 185. For example, pins 1 through 4 may be short-circuited together by engaging multiple short-to-adjacent-pin contact pairs 128 (e.g., S1S2, S2S3, and S3S4.) Further, the short-to-adjacent-pin contact pair 128 of FIG. 3 illustrates the specific contact pair of the group of short-to-adjacent-pin contact pairs 328 of FIG. 3 that is shown in FIG. 2 (e.g., the contact pair 128 labeled S13S14 would short pin 13 of the integrated circuit 110 to pin 14 of the integrated circuit 110.)

The open-pin contact pair 132 is engaged by the pogo pin 185. The first contact point 133 of the open-pin contact pair 132 is electrically coupled to a pin of the integrated circuit 110, while the second contact point 134 of the open-pin contact pair 132 is electrically coupled to electrical components 138 of the integrated circuit testing module 102. In the example shown, engaging the pogo pin 185 would cause the pin of the integrated circuit to be electrically coupled to the electrical components 138 which are typically connected to the integrated circuit. By disengaging the pogo pin 185, an electrical open is created wherein the pin of the integrated circuit is isolated from any other electrical components. In the illustrated example, there are 16 open-pin contact pairs that allow every pin of the integrated circuit to be electrically opened from the electrical components that the pin is typically connected to. There may be more or fewer open-pin contact pairs depending on the integrated circuit being tested. For example, if a pin is typically left open, it may be unnecessary to test the result of opening the pin. In particular, the open-pin contact pair 132 of FIG. 3 illustrates the specific contact pair of the group of open-pin contact pairs 332 of FIG. 3 that is shown in FIG. 2 (e.g., when disengaged, the contact pair 132 labeled O10 would open-circuit pin 10 of the integrated circuit 110 from the electrical components 138 associated with pin 10 of the integrated circuit 110.)

As described in conjunction with FIG. 1, the first set of interconnection points 140 are connected to the electrical test equipment 155 by the probes 160. The first set of interconnection points 140 allow measurements to be taken as close to the pins of the integrated circuit as possible. In the illustrated example, there is a pass-through for each of the interconnection points 140 that are connected directly to the pins of the integrated circuit 110 via the traces of the printed circuit board 115. In the illustrated example, the second set of interconnection points 142 are connected to the electrical test equipment 155 by the cable 150. This allows electrical signals (e.g., power, ground, integrated circuit control signals, etc.) to be provided to the integrated circuit 110. In the illustrated example, the cable is a ribbon cable, however, any other type of cable may additionally or alternatively be used. Additionally or alternatively, the interconnection points 142, 140 may be joined. Further, the interconnection points 142, 140 may be of any form factor. For example, the interconnection points could be jumper pins, contact pads, pass through holes, etc.

The electronic components 138 may be in any configuration. In the illustrated example, the electronic components 138 are arranged and have proper values for testing the specific integrated circuit 110. If a different integrated circuit were to be tested, it is likely that a different configuration of electronic components would be necessary.

Figure 4:
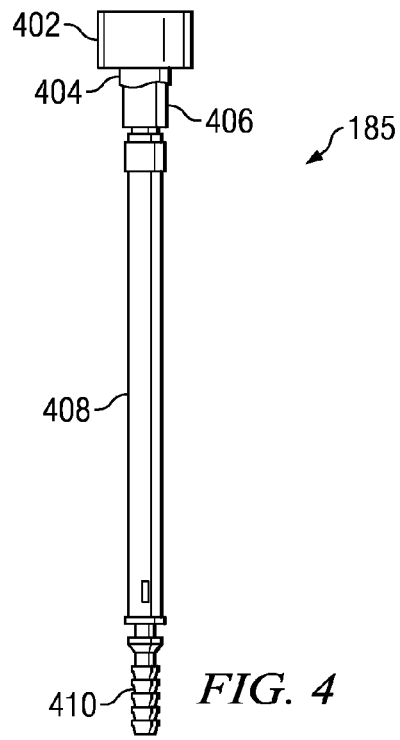
FIG. 4 is a schematic of the pneumatic pogo pin of the integrated circuit testing apparatus of FIG. 1.

FIG. 4 is a schematic of the pneumatic pogo pin 185 of the integrated circuit testing apparatus of FIG. 1. The pneumatic pogo pin 185 contains an electrically conductive probe tip 402, a tip connection 404, a pneumatic probe tip 406, a pneumatic probe shaft 408, and a pneumatic line connector 410. The electrically conductive probe tip 402 is dimensioned to engage the contact pairs of the integrated circuit testing module 102. In the illustrated example, the electrically conductive probe tip 402 is a section of an electrically conductive, resilient material. Additionally, the electrically conductive probe tip 402 is malleable and allows for electrical connections to be made between two sides of a contact pair even when the incident angle of engagement is not optimal (e.g., perpendicular to the integrated circuit testing module 102.) Any other type of electrically conductive membrane may also be used. In the illustrated example, the electrically conductive probe tip 402 is electrically coupled with the other components of the pogo pin 185, however the electrically conductive probe tip 402 may alternatively be electrically isolated from the other components of the pogo pin 185.

The tip connection 404 allows the electrically conductive probe tip 402 to be joined with the pneumatic probe tip 406. In the illustrated example, the tip connection is a soldered connection between the electrically conductive malleable probe tip 402 and the pneumatic probe tip 406. Any other method of joining the probe tips may alternatively be used. For example, the electrically conductive probe tip 402 may be glued on to the pneumatic probe tip 406.

The pneumatic probe tip 406 is connected to the shaft 408 of the pogo pin 185, and provides a connection between the shaft of the pogo pin and the electrically conductive probe tip 402. In the illustrated example, the pneumatic probe tip is a cylinder wherein one end contains small spikes. These small spikes allow for greater ease of connection via the soldered tip connection 404. Any other type of pneumatic probe tip may also be used. For example, a conically shaped pneumatic probe tip may be used and may pierce the electrically conductive probe tip. Further, the connection between the conically shaped pneumatic probe tip 406 and the electrically conductive probe tip 402 may be secured by the tip connection 404. As a further example, the pneumatic probe tip 406 may be an electrically conductive malleable material. In that case, the electrically conductive probe tip 402, and the soldered tip connection 404 may be unnecessary.

The pneumatic probe shaft 408 is a pneumatic shaft and is actuated by receiving air pressure. In the illustrated example, the pneumatic shaft contains a spring so that when it is not receiving air pressure it collapses. When receiving air pressure the shaft extends to allow the electrically conductive probe tip 402 to engage the contact pairs of the integrated circuit testing module 102. The pneumatic line connector 410 allows the pogo pin 185 to receive signals from the pin controller 175 by means of the pin control lines 180. In the illustrated example, the pneumatic line connector 410 receives air pressure via a rubber hose, however any other type of pneumatic line connector 410 and pin control lines 180 may be used.

Figure 5:
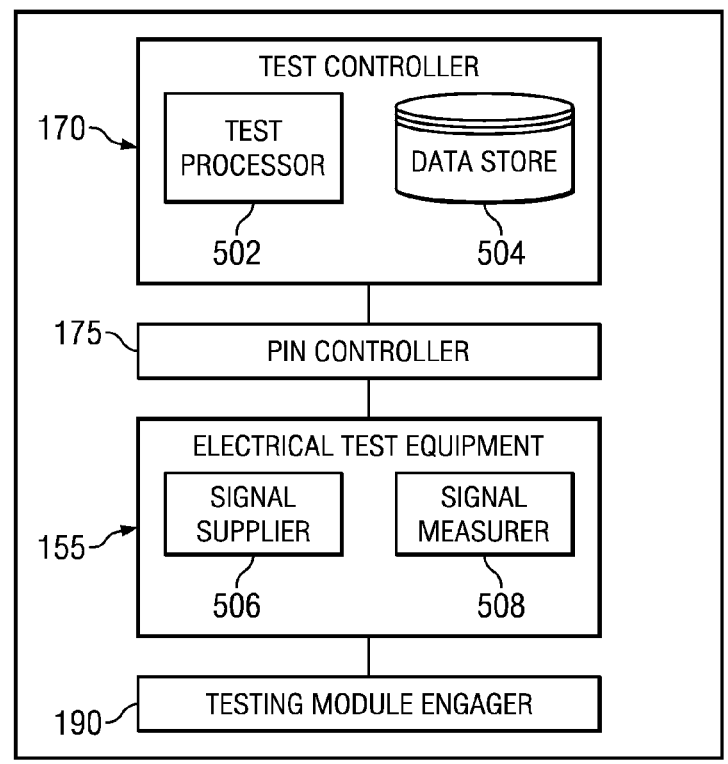
FIG. 5 is a block diagram of the example integrated circuit testing apparatus of FIG. 1.

FIG. 5 is a block diagram of the example integrated circuit testing apparatus 104 of FIG. 1. The example integrated circuit testing apparatus 104 of FIG. 1 comprises a test controller 170 (including a test processor 502 and a data store 504), the pin controller 175, the electrical test equipment 155 (including a signal supplier 506 and a signal measurer 508), and the testing module engager 190. The test controller 170 controls the operation of the other components of the integrated circuit testing apparatus 104. In an example implementation, the test processor 502 reads a test profile containing a list of tests to be performed for a given integrated circuit 110. The test processor 502 may read the test profile from any location. In the illustrated example, the test profile read from the data store 504. The test profile may be in any format. In the illustrated example, the test profile is a flat file stored in the data store 504; however, the test profile may be stored in a database in the data store 504, supplied via user input, etc.

In the illustrated example, the data store 504 is a hard disk drive, however any other kind of data storage device may be used. For example, a memory, a tape drive, or a compact disk may be used to store data. In the example implementation shown in FIG. 5, the data store 504 is a database on a mass storage device 730 (see FIG. 7). The database may be any type of database such as, for example, a flat file database (e.g., a Comma Separated Value (CSV) file, a relational database (e.g., SQL), etc.). The information stored in the data store 504 may be any information used by components of the integrated circuit testing apparatus 104 such as, for example, a test profile, a set of test results, a list of acceptable output values, etc.

The pin controller 175 receives control signals from the test controller 170. Based on the received control signals, the pin controller controls actuation of the pogo pins 185. By activating individual pogo pins the pin controller 175 is able to perform tests as specified by the test controller 170. In the illustrated example, the pin controller 175 is a pneumatic pin controller, however any other type of pin controller may be alternatively or additionally used.

The electrical test equipment 155 of the integrated circuit testing apparatus 104 includes the signal supplier 506, and the signal measurer 508. The signal supplier 506 supplies signals to the integrated circuit testing module 102. In the illustrated example, the signal supplier is a power supply along with a signal generator. However, any other type of signal generating device may also be used. The signal measurer 508 measures and records signals as read from the integrated circuit testing module 102. In the illustrated example, the signal measurer 508 is an oscilloscope; however, any other type of signal measurement device may additionally or alternatively be used.

The testing module engager 190 engages the integrated circuit testing module 102 with the integrated circuit testing apparatus 104. In the illustrated example, this is implemented by a gantry system wherein the integrated circuit testing apparatus 104 is moved into position below a specific integrated circuit testing module 102. Multiple integrated circuit testing modules 102 may be aligned in a predetermined arrangement such that the testing module engager 190 may accurately place the integrated circuit testing apparatus 104 in alignment with each of the integrated circuit testing modules 102. Additionally or alternatively, the testing module engager 190 may be implemented by a robotic arm that picks up the integrated circuit testing module 102 and places it in alignment with the integrated circuit testing apparatus 104. Further, the testing module engager 190 may connect a ribbon cable thereby supplying signal connections to the integrated circuit testing module 102.

While an example manner of implementing the integrated circuit testing system 100 has been illustrated in FIGS. 1 through 5, one or more of the elements, processes, and/or devices illustrated in FIGS. 1 through 5 may be combined, divided, re-arranged, omitted, eliminated, and/or implemented in any other way. Further, the example integrated circuit testing module 102, the integrated circuit testing apparatus 104, the test controller 170, the test processor 502, the data store 504, the pin controller 175, the signal supplier 506, the signal measurer 508, the testing module engager 190 and/or, more generally, the example integrated circuit testing system 100 of FIGS. 1 through 5 may be implemented by hardware, software, firmware and/or any combination of hardware, software and/or firmware. Thus, for example, any of the integrated circuit testing module 102, the integrated circuit testing apparatus 104, the test controller 170, the test processor 502, the data store 504, the pin controller 175, the signal supplier 506, the signal measurer 508, the testing module engager 190 and/or, more generally, the example integrated circuit testing system 100 of FIGS. 1 through 5 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the appended apparatus claims are read to cover a purely software and/or firmware implementation, at least one of the example integrated circuit testing module 102, the integrated circuit testing apparatus 104, the test controller 170, the test processor 502, the data store 504, the pin controller 175, the signal supplier 506, the signal measurer 508, and/or the testing module engager 190 are hereby expressly defined to include a tangible medium such as a memory, DVD, CD, etc. storing the software and/or firmware. Further still, the example integrated circuit testing system 100 of FIGS. 1 through 5 may include one or more elements, processes and/or devices in addition to, or instead of, those illustrated in FIG. 5, and/or may include more than one of any or all of the illustrated elements, processes and devices.

Figure 6:
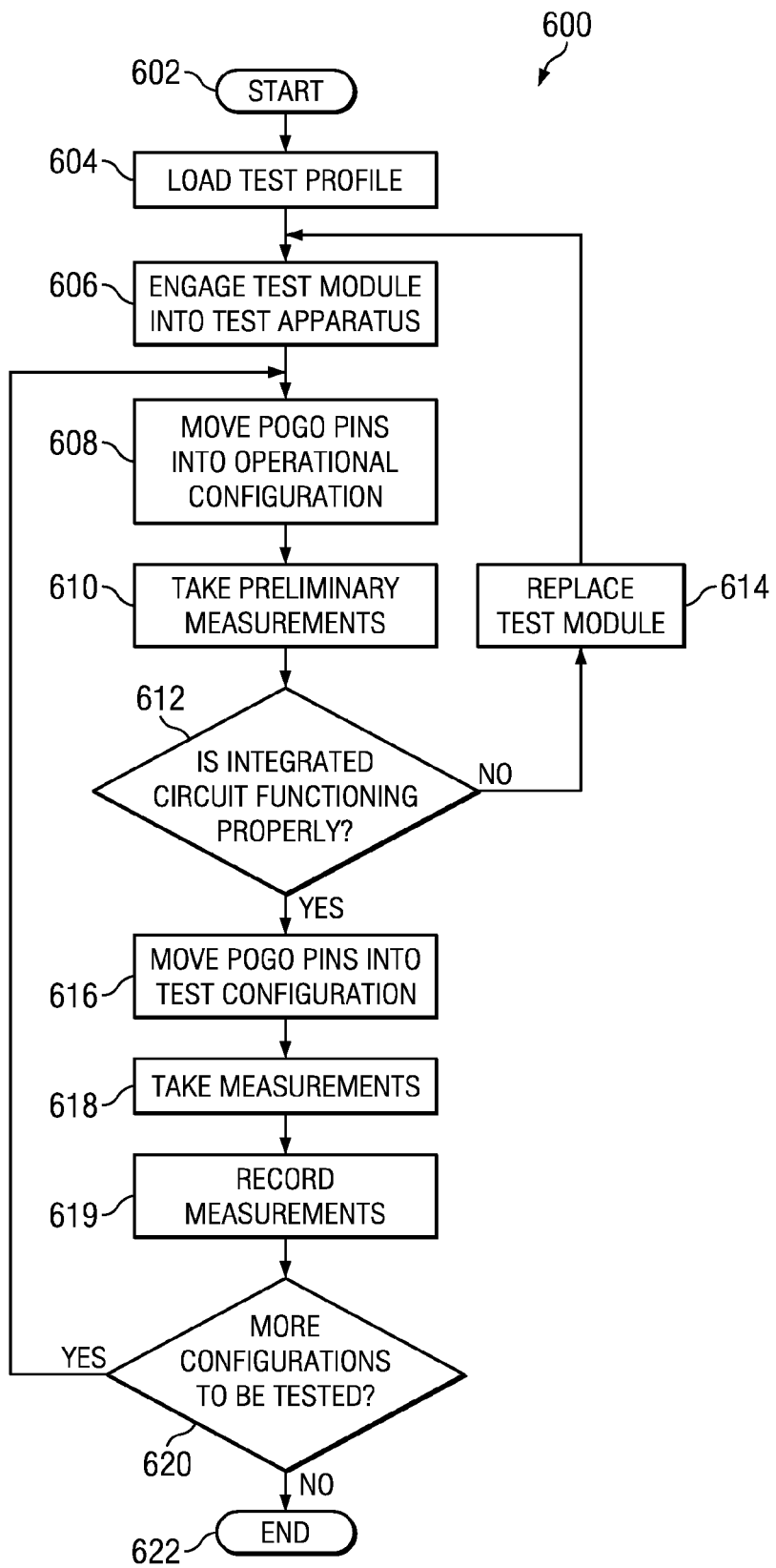
FIG. 6 is a flowchart representative of an example process, which may be implemented using machine readable instructions, that may be carried out to implement the integrated circuit testing system of FIG. 5.

FIG. 6 is a flowchart representative of an example process 600, which may be implemented using machine readable instructions, that may be carried out to implement the integrated circuit testing system 100 of FIGS. 1 through 5. In these examples, the machine readable instructions represented by FIG. 6 may comprise one or more programs for execution by: (a) a processor, such as the processor 712 shown in the example computer 700 discussed below in connection with FIG. 7, (b) a controller, (c) the test controller 170, and/or (d) any other suitable device. The one or more programs may be embodied in software stored on a tangible medium such as, for example, a flash memory, a CD-ROM, a floppy disk, a hard drive, a DVD, or a memory associated with the processor 712, but the entire program or programs and/or portions thereof could alternatively be executed by a device other than the processor 712 and/or embodied in firmware or dedicated hardware (e.g., implemented by an application specific integrated circuit (ASIC), a programmable logic device (PLD), a field programmable logic device (FPLD), discreet logic, etc.). For example, any or all of the machine readable instructions represented by the flowchart of FIG. 6 could be implemented by any combination of software, hardware, and/or firmware. Also, some or all of the machine readable instructions represented by the flowchart of FIG. 6 may be implemented manually. Further, although the example machine readable instructions are described with reference to the flowchart illustrated in FIG. 6, many other techniques for implementing the example methods and apparatus described herein may alternatively be used. For example, with reference to the flowchart illustrated in FIG. 6, the order of execution of the blocks may be changed, and/or some of the blocks described may be changed, eliminated, combined, and/or subdivided into multiple blocks.

Figure 7:
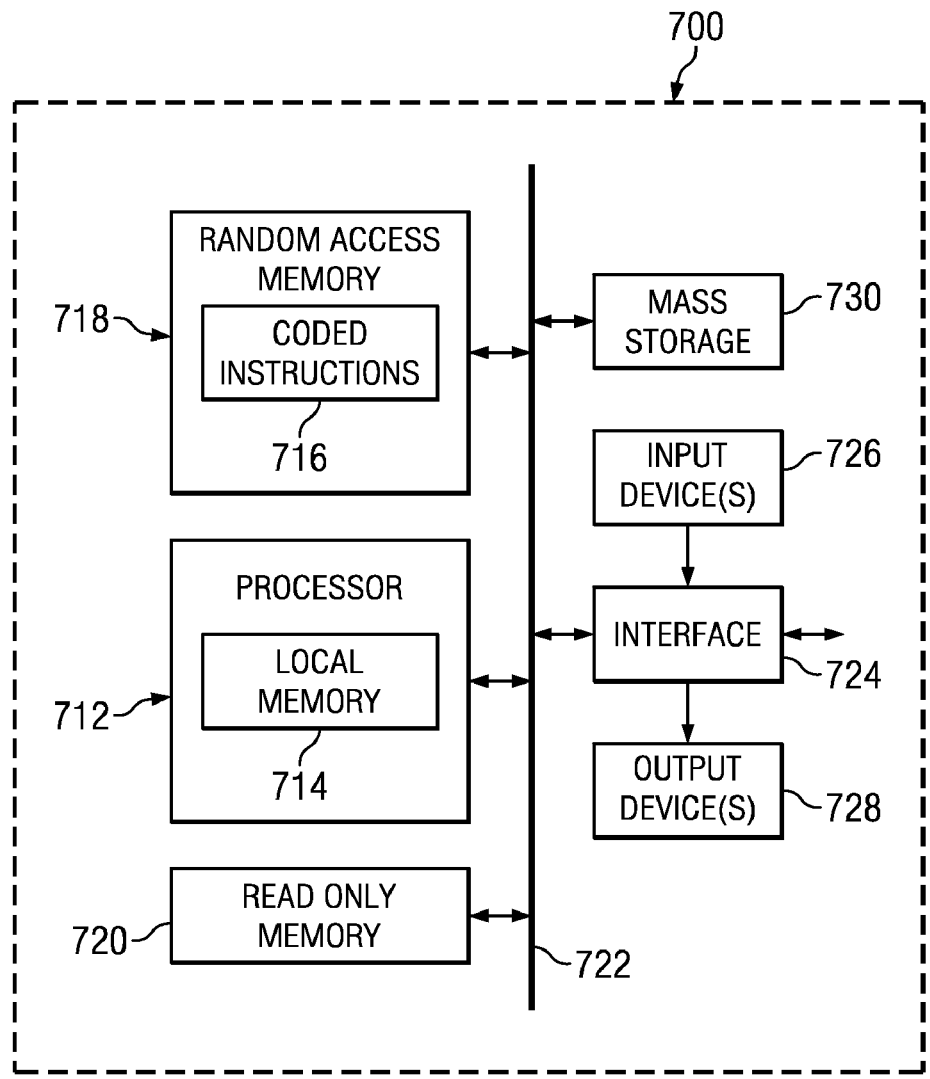
FIG. 7 is a block diagram of an example processor system that may be used to carry out the processes of FIG. 6 to implement the example methods and apparatus described herein.

The illustrated process 600 is embodied in one or more software or firmware programs which are stored in one or more memories (e.g., the random access memory 718 and/or the mass storage 730 of FIG. 7, the data store 504 of the test controller 170 of FIG. 5) and executed by one or more processors (e.g., the processor 712 of FIG. 7, the test controller 170 of FIG. 1). However, some or all of the blocks of the process 600 may be performed under user control and/or by some other device. Although the process 600 is described with reference to the flowchart illustrated in FIG. 6, many other methods of performing the process 600 may be used. For example, the order of the blocks may be altered, the operation of one or more blocks may be changed, blocks may be combined, and/or blocks may be eliminated.

The example process 600 begins when a request is received for a test to be performed on an integrated circuit. The test request may be received by any means. In the illustrated example, the test controller 170 receives a test request from user input. A user selects a test or set of tests to be performed and the test controller 170 proceeds to perform the tests. The test processor 502 loads the test profile from the data store 504 (block 604.) The test profile determines which tests to perform and in what order. Once the test profile is loaded, the testing module engager 190 engages the integrated circuit testing module 102 into the integrated circuit testing apparatus 104 (block 606.) Multiple integrated circuit testing modules may be used over the course of a test profile. For example, if a stimulus damages the integrated circuit, additional tests against the integrated circuit would all return failures as the integrated circuit was damaged prior to testing. Therefore, the testing module engager 190 may have a set of integrated circuit testing modules 102 that may be tested. Additionally, there may be a discard location, for integrated circuit testing modules which have been determined to have been damaged.

After the testing module is engaged, the pin controller 175 moves pogo pins into an operational configuration (block 608.) The operational configuration for a given integrated circuit may include shorting all of the open-pin contact pairs. Any alternative combination may also be used. Next, the signal supplier 506 and signal measurer 508 supply signals and take preliminary measurements, respectively (block 610.) The signal supplier 506 may supply a test signal or set of test signals, and responses to those signals may be measured by the signal measurer 508. The test processor 502 then determines if the integrated circuit is functioning properly based on the measurements and the expected values (block 612.) If the integrated circuit is deemed to be functioning improperly (e.g., the integrated circuit may have been damaged in a previous test,) the testing module engager 190 may disengage the current integrated circuit testing module 102 and replace it with another (block 614.) If the integrated circuit is deemed to be functioning properly, the pin controller 175 moves the pogo pins 185 into a test configuration (block 606.) The signal supplier 506 and the signal measurer 508 take test measurements (block 618.) The measurements may be any type of measurements. For example, the measurements may simply include a voltage and current of a single output pin. Alternatively, the measurements may include a voltage and current of multiple output pins. Further, the measurements may include results of a sweep, wherein outputs of the integrated circuit are tested over a range of input values. The measurements may simply indicate whether the output value was within an acceptable range and thereby show a pass or failure.

After measurements have been taken, the test processor 502 stores the measurements in the data store 504 (block 619.) The measurements may be stored in any fashion within the data store. In the illustrated example, the measurements are stored in a flat text file (e.g., a Comma Separated Value file (CSV).) However, any other method of storing data may be used such as, for example, a relation database, a binary file, etc.

After measurements have been stored, the test processor 502 determines if more pin configurations need to be tested. The test profile may specify hundreds of pin combinations, the test processor 502 is then responsible for accurately testing each of those configurations. If additional configurations exist to be tested, control proceeds to block 608, where it is consequently determined if the integrated circuit testing module has been damaged by the previous test. Alternatively, the test processor 502 may be configured to always assume that the integrated circuit testing module has been damaged by a previous test and may instead proceed to block 614, where the integrated circuit testing module is replaced. If all tests are complete, control proceeds to block 622. The test processor 502 then completes the test profile (block 622), and may alert the user that the tests are complete. Alerting the user may be completed by prompting via a user interface, however any other method of alert may be used such as, for example, an email message, a text message, etc.

FIG. 7 is a block diagram of an example processor platform 700 capable of implementing the apparatus and methods disclosed herein. The processor platform 700 can be, for example, the test controller 170, a server, a personal computer, a personal digital assistant (PDA), an Internet appliance, a dedicated device, or any other type of computing device.

The system 700 of the instant example includes a processor 712 such as a general purpose programmable processor. The processor 712 includes a local memory 714, and executes coded instructions 716 present in the local memory 714 and/or in another memory device. The processor 712 may execute, among other things, the machine readable instructions represented in FIG. 7. The processor 712 may be any type of processing unit, such as one or more microprocessors from the Intel® Centrino® family of microprocessors, the Intel® Pentium® family of microprocessors, the Intel® Itanium® family of microprocessors, and/or the Intel XScale® family of processors. Of course, other processors from other families are also appropriate.

The processor 712 is in communication with a main memory including a volatile memory 718 and a non-volatile memory 720 via a bus 722. The volatile memory 718 may be implemented by Static Random Access Memory (SRAM), Synchronous Dynamic Random Access Memory (SDRAM), Dynamic Random Access Memory (DRAM), RAMBUS Dynamic Random Access Memory (RDRAM), and/or any other type of random access memory device. The non-volatile memory 720 may be implemented by flash memory and/or any other desired type of memory device. Access to the main memory 718, 720 is typically controlled by a memory controller (not shown).

The processor platform 700 also includes an interface circuit 724. The interface circuit 724 may be implemented by any type of interface standard, such as an Ethernet interface, a universal serial bus (USB), and/or a third generation input/output (3GIO) interface.

One or more input devices 726 are connected to the interface circuit 724. The input device(s) 726 permit a user to enter data and commands into the processor 712. The input device(s) can be implemented by, for example, a keyboard, a mouse, a touchscreen, a track-pad, a trackball, an isopoint, and/or a voice recognition system.

One or more output devices 728 are also connected to the interface circuit 724. The output devices 728 can be implemented, for example, by display devices (e.g., a liquid crystal display, a cathode ray tube display (CRT)), by a printer and/or by speakers. The interface circuit 724, thus, typically includes a graphics driver card.

The interface circuit 724 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The processor platform 700 also includes one or more mass storage devices 730 for storing software and data. Examples of such mass storage devices 730 include floppy disk drives, hard drive disks, compact disk drives, and digital versatile disk (DVD) drives. The mass storage device 730 may implement the example data store 504. Alternatively, the volatile memory 718 may implement the example data stores 504.

As an alternative to implementing the methods and/or apparatus described herein in a system such as the device of FIG. 7, the methods and or apparatus described herein may be embedded in a structure such as a processor and/or an ASIC (application specific integrated circuit).

Although the above discloses example systems including, among other components, software executed on hardware, it should be noted that such systems are merely illustrative and should not be considered as limiting. For example, it is contemplated that any or all of the disclosed hardware and software components could be embodied exclusively in dedicated hardware, exclusively in software, exclusively in firmware or in some combination of hardware, firmware and/or software.

In addition, although certain methods, apparatus, and articles of manufacture have been described herein, the scope of coverage of this patent is not limited thereto. On the contrary, this patent covers all apparatus, methods, and articles of manufacture fairly falling within the scope of the appended claims either literally or under the doctrine of equivalents.

What is claimed is:

1. A method for open and short testing an integrated circuit, the method comprising:
engaging an integrated circuit testing module with an integrated circuit testing apparatus, the integrated circuit testing module having an integrated circuit to be tested, a first set of contact points, and a second set of contact points, wherein the first set of contact points are electrically coupled to the pins of the integrated circuit, and wherein contact points of the second set are aligned in contact pairs, the contact pairs being aligned to allow a first pin of the integrated circuit to be at least one of disconnected from any signal on the integrated circuit testing module or electrically shorted to at least one of a second pin of the integrated circuit, a ground connection, or a power connection;
engaging a first probe of the integrated circuit testing apparatus onto at least one of the contact points of the first set of contact points;
controllably engaging at least one of a second probe of the integrated circuit testing apparatus onto at least one contact pair of the integrated circuit testing module, thereby creating an electrical short between the at least two contact points of the second set; and
providing an electrical stimulus to the integrated circuit testing module.

2. The method as described in claim 1, further comprising:
determining if the response of the integrated circuit is within an acceptable range of outputs given the input stimulus and the configuration of the at least one of the second probe.

3. The method as described in claim 2, further comprising:
disengaging the integrated circuit testing module from the integrated circuit testing apparatus, and reengaging a second integrated circuit testing module when it is determined that the response of the integrated circuit is not within an acceptable range of outputs.

4. The method as described in claim 1, wherein the integrated circuit testing module further includes a third set of contact points and the integrated circuit testing apparatus further includes a cable to engage the third set of contact points of the integrated circuit testing module.

5. The method as described in claim 4, wherein the cable is a ribbon cable.

6. The method as described in claim 4, wherein the electrical stimulus is provided to the integrated circuit testing module via the cable.

7. The method as described in claim 1, wherein engaging the integrated circuit with the integrated circuit testing module comprises permanently attaching the integrated circuit to the integrated circuit testing module.

8. The method as described in claim 1, wherein engaging the integrated circuit with the integrated circuit testing module comprises electrically coupling the pins of the integrated circuit to the first set of contact points.

9. The method as described in claim 1, wherein the first pin of the integrated circuit and the second pin of the integrated circuit are adjacent.

10. The method as described in claim 1, further comprising:
measuring a response of the integrated circuit via the first probe.

11. A system for open and short testing of an integrated circuit, the apparatus comprising:
an integrated circuit testing module to engage an integrated circuit, the integrated circuit testing module having a first set of contact points electrically coupled to the pins of the integrated circuit, and a second set of contact points;
an integrated circuit testing apparatus to engage the integrated circuit testing module, the integrated circuit testing apparatus having at least one of a first probe and at least one of a second probe;
the first set of contact points to allow the first probe to be electrically connected to the pins of the integrated circuit; and
the second set of contact points to allow the second probe to at least one of electrically short or electrically open at least one of the pins of the integrated circuit.

12. The system as described in claim 11, wherein the first probe has an electrically conductive tip.

13. The system as described in claim 11, wherein the first probe is a fixed-location, spring-based probe.

14. The system as described in claim 11, wherein the second probe has an electrically conductive malleable tip.

15. The system as described in claim 11, wherein the second probe is pneumatically actuated.

16. The system as described in claim 11, wherein the second set of contact points are aligned in contact pairs.

17. The system as described in claim 16, wherein the contact pairs form a square separated by a saw tooth shaped gap.

18. A method for open and short testing of an integrated circuit, the method comprising:
engaging an integrated circuit testing module with an integrated circuit testing apparatus, the integrated circuit testing module having an integrated circuit to be tested, a first set of contact points, a second set of contact points, and a third set of contact points, wherein the first set of contact points are electrically coupled to the pins of the integrated circuit, and wherein contact points of the second set are aligned in contact pairs, the contact pairs being aligned to allow a first pin of the integrated circuit to be at least one of disconnected from any signal on the integrated circuit testing module or electrically shorted to at least one of a second pin of the integrated circuit, a ground connection, or a power connection;
engaging a first probe of the integrated circuit testing apparatus onto at least one of the contact points of the first set of contact points;
controllably engaging at least one of a second probe of the integrated circuit testing apparatus onto at least one contact pair of the integrated circuit testing module, thereby creating an electrical short between the at least two contact points of the second set;

engaging a cable of the integrated circuit testing apparatus on to the third set of contact points;

providing an electrical stimulus to the integrated circuit testing module via at least one of the cable or the first probe;

measuring a response of the integrated circuit via the first probe;

determining if the response of the integrated circuit is within an acceptable range of outputs given the input stimulus and the configuration of the at least one of the second probe; and disengaging the integrated circuit testing module from the integrated circuit testing apparatus when it is determined that the response of the integrated circuit is not within an acceptable range of outputs, and engaging a second integrated circuit testing module.

19. The method as described in claim 18, wherein at least one of the second probe has an electrically conductive malleable tip.

20. The method as described in claim 18, wherein engaging and disengaging the integrated circuit testing module into and out of the integrated circuit testing apparatus comprises robotically moving at least one of the integrated circuit testing module or the integrated circuit testing apparatus.

\* \* \* \* \*